United States Patent

Castrucci et al.

[15] 3,648,130

[45] Mar. 7, 1972

[54] COMMON EMITTER TRANSISTOR INTEGRATED CIRCUIT STRUCTURE

[72] Inventors: Paul P. Castrucci, Poughkeepsie; Edward G. Grochowski, Wappingers Falls; William D. North, Poughkeepsie; Thomas L. Palfi, Yorktown Heights, all of N.Y.

[73] Assignee: International Business Machines Corporation, Armonk, N.Y.

[22] Filed: July 16, 1969

[21] Appl. No.: 842,195

[52] U.S. Cl. .....................317/235 R, 317/235 D, 317/235 E, 317/235 X, 148/175, 307/279

[51] Int. Cl. .............................................................H01l 19/00

[58] Field of Search .................................................317/235

[56] References Cited

UNITED STATES PATENTS

| | | | |
|---|---|---|---|
| 3,244,950 | 4/1966 | Ferguson | 317/235 |
| 3,440,498 | 4/1969 | Mitchell | 317/235 |
| 3,502,951 | 3/1970 | Hunts | 317/235 |
| 3,336,508 | 8/1967 | Preletz et al. | 317/235 |
| 3,474,308 | 10/1969 | Kronlage | 317/235 |

*Primary Examiner*—Jerry D. Craig
*Attorney*—Hanifin and Jancin and Julius B. Kraft

[57] ABSTRACT

A planar integrated semiconductor circuit having common emitter transistor elements isolated from each other and from other transistors by the emitter regions which form a PN- or rectifying junction with the body of the semiconductor member in which the integrated circuit is formed. In a semiconductor member or body of one type conductivity, a plurality of emitter regions of opposite type conductivity extend from one planar surface of the body. One or more of the emitter regions each have a plurality of discrete base regions of the one type conductivity extending from said planar surface fully enclosed within the emitter region. Each of the base regions in turn has at least one collector region enclosed within it at the planar surface. The emitter region has a higher majority carrier concentration than the majority carrier concentration within its enclosed base regions. The rectifying junction formed by the opposite conductivity emitter region with the one type conductivity semiconductor body serves to isolate the emitter regions from each other.

4 Claims, 6 Drawing Figures

*INVENTORS*
PAUL P. CASTRUCCI
EDWARD G. GROCHOWSKI
WILLIAM D. NORTH
THOMAS L. PALFI

*BY* J. B. Kraft
*ATTORNEY*

COMMON EMITTER TRANSISTOR INTEGRATED CIRCUIT STRUCTURE

CROSS-REFERENCE

Application Ser. No. 820,178, filed June 29, 1969, and assigned to the assignee of the present invention, discloses transistors with common regions. They differ from the structure of the present invention in that they do not contain any heavily doped buried regions as part of their common regions.

BACKGROUND OF THE INVENTION

1. Field of the Invention

The present invention relates to semiconductor structures, particularly to common emitter transistor structures which may be incorporated into such integrated circuits.

2. Description of the Prior Art

Conventional semiconductor planar integrated circuits require transistor structures which are capable of being fabricated by diffusion through one surface of the integrated circuit member usually referred to as the front or top surface. In order to facilitate interconnections between elements in the integrated circuit, all three active regions of the transistor, e.g., emitter, base and collector, are required to extend to the front or top surface of the integrated circuit member. In the standard transistor structures used in integrated circuits, the collector regions are usually formed first and extend most deeply into the integrated circuit member or wafer. The base regions are then formed by diffusion into the collector regions and, consequently, are located above the collector region with respect to the surface. The emitter regions are formed by a final diffusion into the base region and, consequently, are located above the base region with respect to the surface. While originally these conventional planar transistor structures were formed by a triple diffusion of the collector, base and emitter regions respectively into a substrate, the most common integrated transistor structure in present technology involves an N+ type subcollector region buried at the surface of a P-type substrate under an N-type epitaxy with the base and emitter regions being formed in the epitaxy above the buried subcollector by a double diffusion technique. A typical structure of this type is shown and described in the text *Integrated Circuits*, edited by R. M. Warner, Jr. of the Motorola Series on Solid State Electronics, particularly with reference to FIG. 10–7, page 189.

While the transistor having the conventional order of regions, collector below base below emitter, has virtually universal usage in planar integrated circuits, this conventional order has at least one significant shortcoming. The conventional transistor integrated circuit structure is less than fully effective in the integration of common emitter transistor structures. Such common emitter transistor structures are in wide usage both in memory and logic applications of integrated circuits, and it would be desirable to have a transistor structure in which the connection of a plurality of emitters is readily achieved. Because the emitter region in conventional integrated circuits is the uppermost region, it is completely isolated and internal emitter interconnections within the integrated circuit semiconductor body are not feasible. Accordingly, conventional surface metallic interconnections must be made between emitters. Unfortunately, with the ever increasing miniaturization of integrated circuits involving up to thousands of active and passive devices on a single integrated circuit chip, the surface area available for interconnections has significantly diminished. In addition, such surface interconnections between common emitters in integrated circuits have required crossovers of metallic interconnectors. Such crossovers may be conventionally accomplished by using at least two electrically isolating layers on the integrated circuit surface to separate the interconnections crossing each other. This clearly involves many additional fabrication steps. Alternatively, underpass crossovers have been used, wherein diffused conductive regions within the semiconductor body itself have been utilized for the passage of a metallic surface interconnection under another metallic surface interconnection. Such underpass structures use up valuable integrated circuit "real estate" which is very undesirable in view of the trend towards increased device density in chips.

It follows then that transistor structures in which common emitters could be connected internally would be very desirable. In seeking such internal common emitter structures, the art has considered inverse transistors having common emitters. However, no commercially practical, integrated inverse planar common emitter structure has been found in which all three active regions extend to the top surface of the semiconductor body. It is not practical to produce an inverse transistor by triple diffusion techniques, wherein the emitter region is diffused first into the substrate, followed by the base region being diffused into the emitter region and the collector region subsequently diffused into the base region. Because of diffusion limitations, it is not feasible to form by diffusion a region of opposite type conductivity having a majority carrier concentration which is lower than the majority carrier concentration in the region being diffused into. Since substantially all practical transistors require a lower majority carrier concentration in the base region than in the emitter region, the triple diffusion technique which requires diffusion of the base region into the emitter region is not feasible for the formation of inverse transistor structures. Likewise, it is not feasible to merely reverse the regions in the standard double diffusion integrated transistor structures which utilizes a high-resistivity epitaxial layer as the collector into which the base and emitter diffusions are subsequently made. If the high-resistivity epitaxial region were used as the emitter, the emitter would not have the desirable higher majority carrier concentration than the majority carrier concentration in the base region.

SUMMARY OF THE INVENTION

Accordingly, it is a primary object of the present invention to provide a novel integrated circuit common emitter transistor structure.

It is a further object of the present invention to provide such an integrated circuit common emitter transistor structure, wherein the great majority of interconnections between emitters are made within the semiconductor body.

It is another object of the present invention to provide a novel common emitter transistor structure which eliminates the need for crossovers or crossunders in the surface interconnection metallurgy.

It is an even further object of the present invention to provide a novel common emitter transistor element in an integrated circuit which is electrically isolated from other transistor elements in the circuit without additional isolation diffusion.

It is yet another object of the present invention to provide a novel integrated circuit monolithic memory cell structure including a plurality of the common emitter transistor structures.

It is a further object of the invention to provide a method for forming the novel integrated circuit common emitter transistor structures of the present invention.

The present invention provides a common emitter structure in a planar integrated circuit which is an inverted transistor structure. In a semiconductor body of one type conductivity, one or more emitter regions of opposite type conductivity extend from one planar surface of said body into the body proper. Each emitter region contains enclosed therein a plurality of discrete base regions of said one type conductivity which extend from said planar surface into the emitter region; the emitter region has a higher majority carrier concentration than the majority carrier concentration in the base region. Each of the respective base regions contains at least one collector formed at said planar surface and enclosed within the base region; the collector is preferably a diffused region of said opposite type conductivity extending into its base region. In the resulting structure, the single emitter acts as a common emitter for the series of transistors provided by the discrete base regions and the collectors enclosed within such base regions. The emitter provides complete isolation for the entire transistor structure contained therein by virtue of the PN- or rectifying junction which the emitter forms with the semiconductor body. This junction serves to isolate the common emitter transistor structure from other common emitter transistors or discrete emitter transistor structures formed in the semiconductor body.

With this common emitter structure, the integrated circuit may be designed so that all transistors which are to have directly coupled emitters are enclosed within a single common emitter isolated unit. Then, the necessary interconnections between bases and collectors contained in the common emitter unit or in other common emitter units, or between emitter regions and bases or collectors in other common emitter units, may be made by conventional surface metallization. Because the need for surface metallization to connect directly coupled emitters is eliminated, there is no attendant need for more extensive and complex surface metallization interconnection patterns which entail the previously described underpass and overpass structures.

The foregoing and other objects, features and advantages of the invention will be apparent from the following more particular description and preferred embodiments of the invention as illustrated in the accompanying drawings.

DESCRIPTION OF THE PREFERRED EMBODIMENTS

Figure 1:
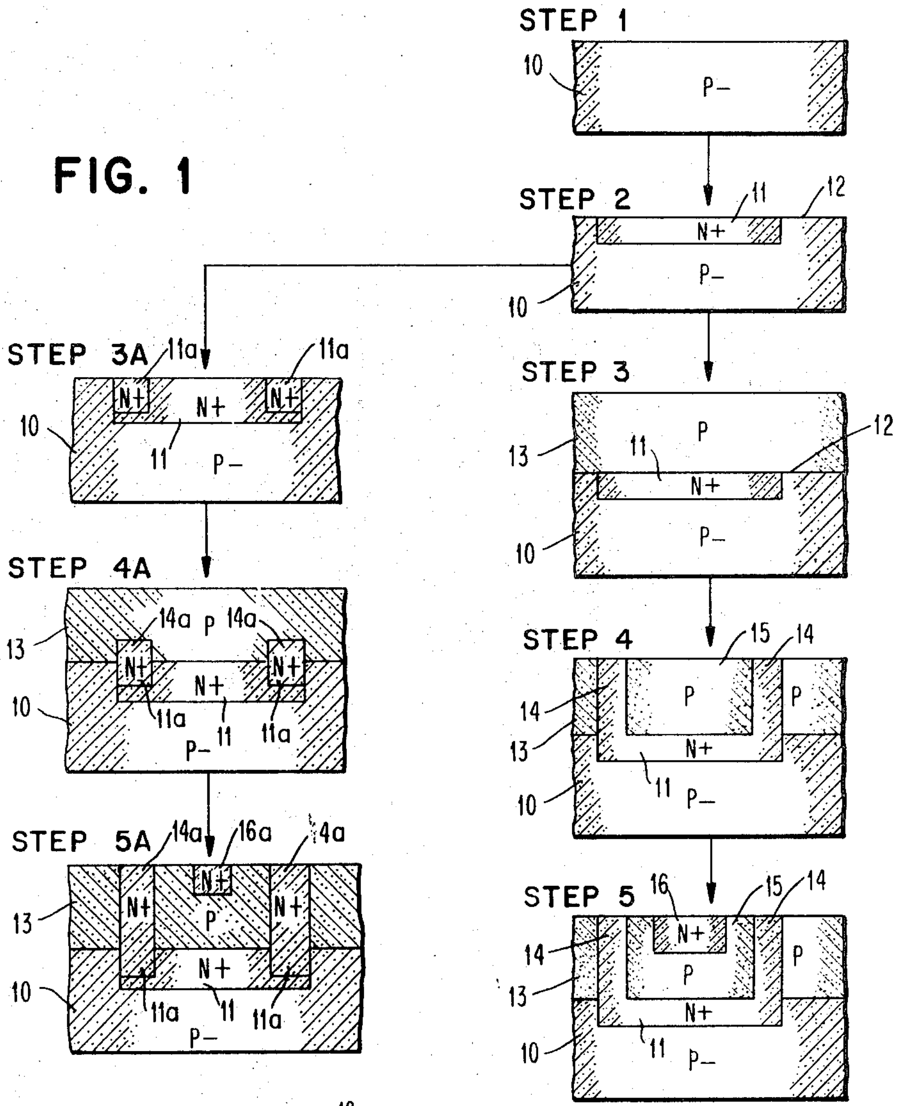
FIG. 1 is a flow diagram, in diagonal cross section, showing the steps in the fabrication of a portion of a transistor unit of the structure of the present invention.

In discussing the semiconductor device of this invention, the usual terminology that is well known in the transistor field will be used. In giving concentrations, references will be made to majority or minority carriers. By "carriers" is signified the free holes or electrons which are responsible for the passage of current through a semiconductor material. "Majority carriers" are used in reference to those carriers in the material under discussion in the majority, i.e., holes in P-type material or electrons in N-type material. By use of the terminology "-minority carriers", it is intended to signify those carriers in the minority, i.e., holes in N-type material or electrons in P-type material. In the most common type of semiconductor materials used in present day transistor structures, carrier concentration is generally due to the concentration of the "significant impurity", that is, impurities which impart conductivity characteristics to extrinsic semiconductor materials.

Although for the purpose of describing this invention reference is made to a semiconductor configuration wherein a P-type region is utilized as the substrate and subsequent semiconductor regions of the composite semiconductor structure are formed in the conductivity types shown in the drawings, it is readily apparent that the same regions shown in the drawings can be of opposite type conductivities.

Referring to the Figure, a wafer of P- type conductivity, preferably having a resistivity in the order of 10 ohm-cm. and a thickness of about 2 to 20 mils, is used as the starting substrate 10, shown in Step 1. The substrate is preferably a monocrystalline silicon structure which can be fabricated by conventional techniques, such as crystal pulling from a melt containing the desired impurity concentration, followed by slicing the crystal into a plurality of wafers. This substrate may also be an epitaxial layer grown on another surface.

An oxide coating, preferably of silicon dioxide and having a thickness of 5,000 A., is either thermally grown by conventional heating in a wet atmosphere at 1,050° C for 60 minutes, or formed by pyrolitic deposition of an oxide layer. Alternatively, an RF sputtering technique, as described in U.S. Pat. No. 3,369,991, may be used to form the silicon dioxide layer. Then, by standard photolithographic masking and etching techniques, a photoresist layer is deposited onto the substrate over the surface of the oxide layer and, by using the photoresist layer as a mask, a surface region is exposed on the surface of the substrate through a hole in the oxide layer formed by etching away the desired portion of the oxide layer with a buffered HF solution. The photoresist layer is then removed to permit further processing.

A diffusion operation is then carried out of diffuse into the surface 12 of the substrate 10 an N+ type region 11, shown in Step 2, having a $C_0$ of $10^{20}$cm.$^{-3}$ of N-type majority carriers. The oxide layer (not shown) serves as a mask to prevent the N+ region 11 from being formed across the entire surface of the substrate 10. Preferably, the diffusion operation is carried out in a conventional evacuated quartz capsule using, preferably, an arsenic-doped silicon powder source.

In Step 3, after removing the oxide layer with a buffered HF solution, a layer 13 of P-type conductivity, preferably having a resistivity of 0.05 to 0.10 ohm-centimeters and a $C_0$ of about $3\times10^{17}$m.$^{-3}$, is epitaxially grown on the surface of the substrate. The epitaxial layer 13 is a boron-doped layer approximately 2 to 4 microns thick. In actual device fabrication, the N-type impurities in the region 11, which is now buried, outdiffuse about 1 micron during the epitaxial deposition.

Then, in accordance with step 4, in circumscribing region 14 is formed by selective diffusion through the epitaxial layer to contact buried region 11. The union of circumscribing region 14 and buried region 11 results in the full enclosure of a plurality of discrete portions 15 of the epitaxial layer for each buried region 11. The circumscribing region 14 is formed by the conventional oxide masking diffusion techniques described above, which involve the formation of a silicon dioxide layer on the surface of epitaxial layer 13 with a suitable opening in the oxide to permit the diffusion of circumscribing region 14. This diffusion is preferably carried out using a standard diffusion technique with an N-type impurity source, such as an open tube diffusion process with a phosphorus source, e.g., phosphorus oxychloride. Region 14 has a $C_0$ of $5\times10^{20}$cm.$^{-3}$. The plurality of enclosures formed by the buried region 11, together with circumscribing region 14, serve as the N-type common emitter, while the enclosed discrete regions 15 provide the base of the transistors having said common emitter. For convenience in illustrating the fabrication process, the structure shown in Step 4 is a section taken at an angle which only shows a single discrete epitaxial base region 15 enclosed within the common emitter formed by regions 11 and 14. However, if reference is made to FIG. 2, it may be readily seen from the central transistor structure that buried region 11, in combination with circumscribing diffused region 14, forms a common emitter which encloses a pair of discrete P-type base regions.

In order to complete the transistor structure, a collector is then formed within each discrete base region, as shown in Step 5. In the preferred embodiment, an N+ collector 16 is formed utilizing the conventional oxide masking photoresist diffusion techniques described above with an N-type impurity, e.g., an open tube diffusion process using phosphorus oxychloride. Collector region 16 preferably has a $C_0$ of about $10^{20}$cm.$^{-3}$.

The common emitter transistor of Step 5 may be alternatively formed as follows. Into N+ buried region 11, an additional N-type region diffusion is made. This diffused region 11*a*, shown in Step 3A, should be coextensive with the circumscribing region to be subsequently formed in the epitaxial layer. Region 11a contains an N-type impurity of greater diffusivity, e.g., a faster diffuser than the N-type impurity in region 11. Since arsenic is the major impurity in region 11, region 11*a* is preferably formed by a conventional diffusion, as previously described, using a phosphorus source. Region 11*a* has a $C_0$ of about $10^{20}cm.^{-3}$. As a result, when the epitaxial region 13 is grown, as shown in Step 4A, there is a significant outdiffusion into the epitaxy from region 11*a* to form region 14*a*. In the final Step 5A, a single diffusion step is carried out to form emitters 16*a* and a diffused region extending from the outer surface of the epitaxial layer which is coincident with outdiffused region 14*a* and joins region 14*a* to complete the circumscribing region which is also designated as 14*a* in the drawings.

Figure 2:
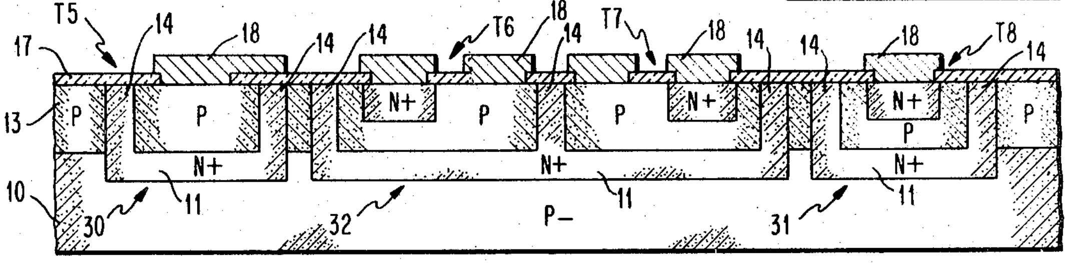
FIG. 2 is a diagonal section of the integrated circuit memory cell taken along lines 2—2 of FIG. 3 which shows the unit in FIG. 1 incorporated in an integrated circuit structure.

An oxide layer is formed over the surface of the epitaxial layer, contacts to the outer regions in the transistor structure are formed in the standard manner and appropriate metallization is applied to form ohmic contacts and surface interconnectors. A section of the completed structure is shown in FIG. 2 with the oxide layer designated as 17 and the metallization designated as 18.

Integrated circuit memory structures or monolithic memory semiconductor structures employ integrated transistors between which there is extensive emitter-to-emitter interconnection. Monolithic memory storage cells employ paired transistors in a bistable or flip flop circuit configuration. These cells are repeated in the horizontal (X) and vertical (Y) directions to form an overall monolithic memory array. One such typical array is described in U.S. Pat. No. 3,423,737, Harper. In the array of the Harper patent, particularly that shown in FIG. 4, the emitters of the transistors forming the array are interconnected in such a manner that there are eight emitters commonly connected in each horizontal line which are used for word addressing, and three commonly connected emitters in the vertical lines which are used for the input and output of bits. It is clear from the nature of the Harper array that any number of emitters may be commonly interconnected in both the horizontal and vertical directions. If conventional transistor structures are used to implement the array shown in the Harper patent, the vertical and horizontal interconnections between the common emitters have to be made by surface metallization. However, using the novel common emitter transistor structure of the present invention, the interconnections between the emitters may be accomplished primarily within the semiconductor body.

Figure 3:
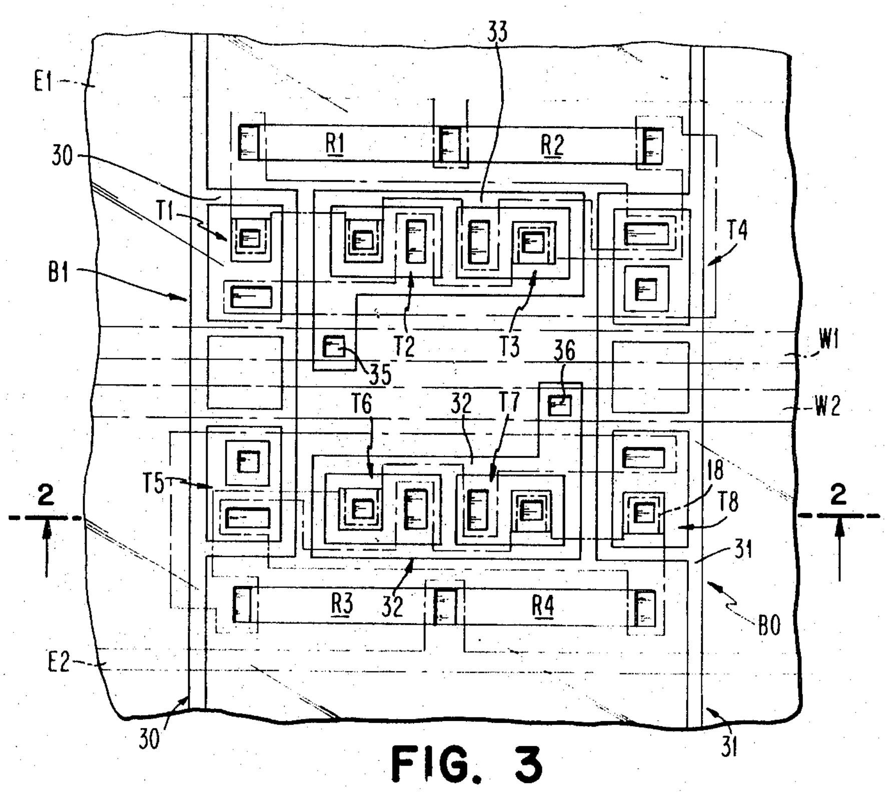
FIG. 3 is a plan view of a memory cell which is a memory cell portion of an integrated circuit with the diffused regions being shown in solid lines, the surface metallic interconnectors being shown in phantom lines, and the ohmic contacts being shown as shaded areas.
Figure 4:
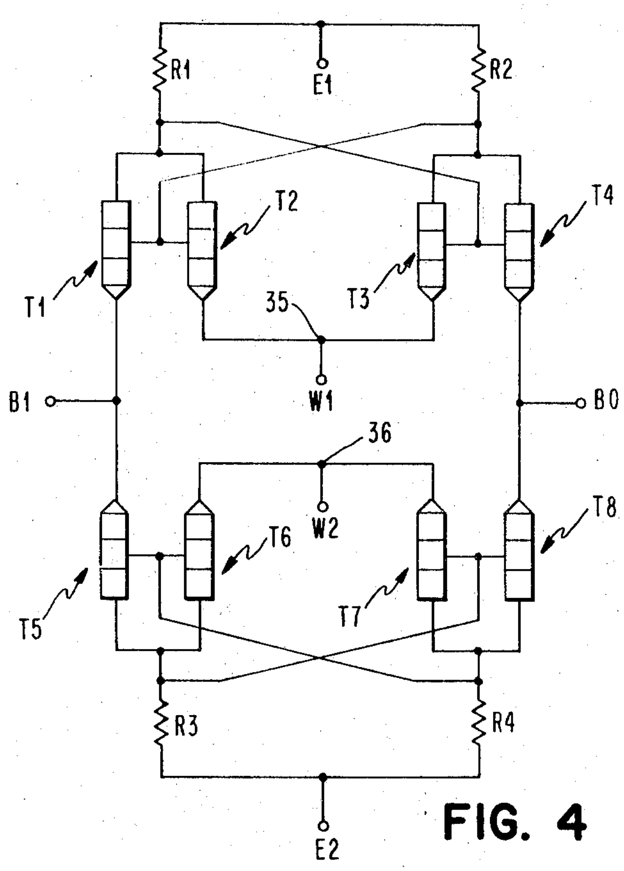
FIG. 4 is a circuit diagram of the memory cell structure of FIG. 3.

The embodiment of FIG. 3, which is shown in circuit diagram in FIG. 4, illustrates how the common emitter inverted transistor structure described herein may be used in a memory cell with common emitters in both the vertical and horizontal directions. The structure in FIG. 3 will be better understood if read in coordination with FIG. 2, which is a section of FIG. 3 along line 2—2. N-region 30 is a vertically disposed common emitter region which serves as the common emitter region for transistors T1 and T5, the emitters of which are common in the vertical direction. Likewise, N-region 31 serves as the common emitter for transistors T4 and T8, the emitters of which are also common in the vertical direction. Horizontally disposed, common emitter region 32 serves as the common emitter region for transistors T6 and T7, the emitters of which are common in the horizontal direction. Likewise, horizontally disposed common emitter region 33 serves as the common emitter for transistors T2 and T3, the emitters of which are also common in the vertical direction. Bits B1 and $B_0$ are respectively applied internally to the vertically disposed common emitters 30 and 31, while word addresses W1 and W2 are respectively applied by means of surface metallic interconnectors, shown in phantom line, respectively to horizontally disposed common emitters 33 and 32 via contacts 35 and 36. Voltage levels E1 and E2 are respectively applied to resistors R1 and R2 and resistors R3 and R4 by the surface metallization shown in FIG. 3. The common connection between the bases and collectors of transistors T1 and T2, T3 and T4, T5 and T6, as well as T7 and T8, is made by the surface metallization interconnectors, as shown in FIG. 3. Also, the cross coupling between transistors T2 and T3, as well as t6 and T7, is made by surface metallization interconnectors.

Figure 5:
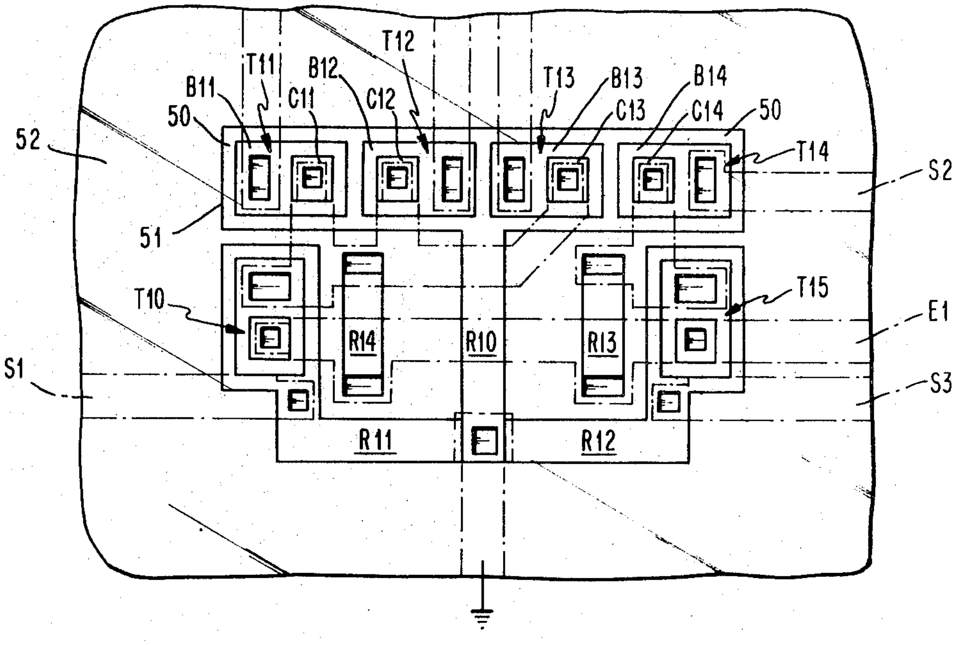
FIG. 5 is a plan view, similar to that of FIG. 3, of an integrated common emitter transistor structure used to embody a logic circuit.
Figure 6:
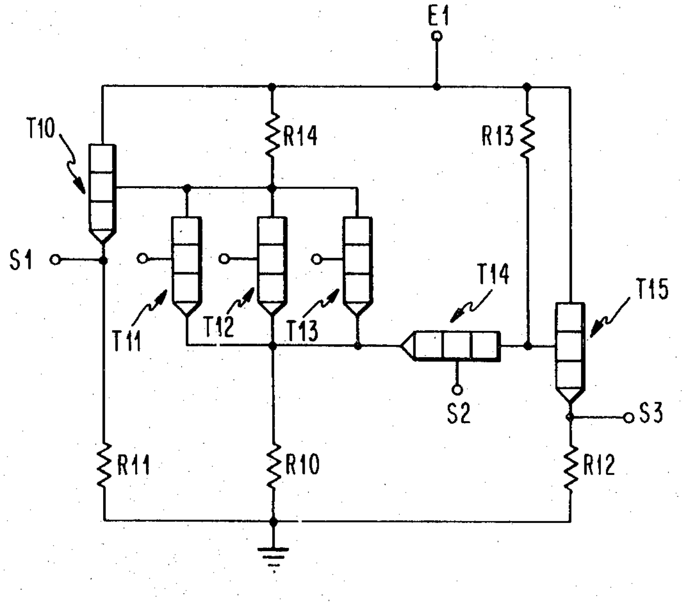
FIG. 6 is a circuit diagram of the logic circuit embodied in the structure of FIG. 5.

The novel common emitter integrated circuit structure of the present invention may also be used in coupling transistors with common emitter circuit configurations in a logic structure. FIG. 5 shows the plan view of a common emitter transistor embodiment of the circuit shown in FIG. 6. Region 50 in FIG. 5 serves as the common emitter for transistors T11, T12, T13 and T14, with discrete base regions B11, B12, B13 and B14 of these transistors being fully enclosed within common emitter region 50. Collector regions C11 through C14 are respectively enclosed within the base regions. Common emitter region 50 is isolated from the emitters of transistors 10 and 15 by rectifying junction 51 formed between emitter region 50 and the body of the semiconductor substrate 52.

It should be understood that the common emitter transistors of the present invention may be integrated into a monolithic integrated circuit, no only with other inverted transistors wherein the emitter region is lowermost, but also with planar transistors arranged in the conventional order wherein the collector is lowermost.

While the collector regions of the common emitter transistors described herein have been diffused regions, Schottky-Barrier collectors enclosed within the base region and formed at the surface thereof may also be used. The fabrication of such Schottky-Barrier collectors in integrated circuit transistors is described in a copending application entitled "An Inverted Transistor Structure and Fabrication Method Therefor", Benjamin Agusta, filed on or about June 30, 1969, and assigned to the same assignee as the present application. This copending application is directed to inverted transistors and particularly to inverted transistors with Schottky-Barrier collectors. The collectors in the present application may also be formed by other known means, such as etching a depression into the surface of the base region and refilling the depression with semiconductor material of opposite type of epitaxial growth.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A planar integrated semiconductor circuit comprising:
a semiconductor substrate of one type conductivity;
a layer of semiconductor material of said one type conductivity on a surface of said substrate to form an interface;
a plurality of heavily doped buried regions of opposite type conductivity located in said substrate at said interface;
at least one circumscribing region of said opposite type conductivity extending from the outer surface of said semiconductor layer to contact each of said buried regions, each of said circumscribing regions together with the buried region which it contacts fully enclosing at least one discrete portion of said one type conductivity layer, said enclosed portion forming a base region of a transistor, and the circumscribing region together with the buried region forming the emitter region, at least one of said emitter regions being a common emitter region having a plurality of discrete base regions so enclosed therein; and
at least one collector formed at the surface of and enclosed with each base region.

2. The integrated semiconductor structure of claim 1 wherein said layer of semiconductor material is an epitaxial layer.

3. The integrated semiconductor structure of claim 2 wherein each collector is a region of said opposite type conductivity extending from the outer surface within the base region.

4. The integrated semiconductor structure of claim 1 wherein at least one collector is a Schottky-Barrier collector.

* * * * *